United States Patent
Kato et al.

(10) Patent No.: US 10,150,902 B2
(45) Date of Patent: Dec. 11, 2018

(54) THERMALLY CONDUCTIVE SILICONE COMPOSITION AND ELECTRICAL/ELECTRONIC APPARATUS

(71) Applicant: Dow Corning Toray Co., Ltd., Tokyo (JP)

(72) Inventors: Tomoko Kato, Chiba (JP); Harumi Kodama, Chiba (JP); Masayuki Onishi, Chiba (JP)

(73) Assignee: Dow Corning Toray Co., Ltd., Tokyo (JP)

( * ) Notice: Subject to any disclaimer, the term of this patent is extended or adjusted under 35 U.S.C. 154(b) by 0 days.

(21) Appl. No.: 15/302,555

(22) PCT Filed: Mar. 26, 2015

(86) PCT No.: PCT/JP2015/001762
§ 371 (c)(1),
(2) Date: Nov. 18, 2016

(87) PCT Pub. No.: WO2015/155948
PCT Pub. Date: Oct. 15, 2015

(65) Prior Publication Data
US 2017/0081578 A1    Mar. 23, 2017

(30) Foreign Application Priority Data
Apr. 9, 2014   (JP) ................. 2014-079875

(51) Int. Cl.
C09K 5/10      (2006.01)
C08L 83/14     (2006.01)
H01L 23/373    (2006.01)
C08L 83/06     (2006.01)
H01L 23/42     (2006.01)
C08K 3/22      (2006.01)
C08K 3/28      (2006.01)
C08K 3/38      (2006.01)

(52) U.S. Cl.
CPC .............. *C09K 5/10* (2013.01); *C08K 3/22* (2013.01); *C08K 3/28* (2013.01); *C08K 3/38* (2013.01); *C08L 83/06* (2013.01); *C08L 83/14* (2013.01); *H01L 23/373* (2013.01); *H01L 23/3737* (2013.01); *H01L 23/42* (2013.01); *C08K 2003/2227* (2013.01); *C08K 2003/282* (2013.01); *C08K 2003/385* (2013.01); *C08K 2201/001* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 3,885,984 A | 5/1975 | Wright | |
| 6,306,957 B1 * | 10/2001 | Nakano | C08L 83/04 524/700 |
| 9,752,007 B2 * | 9/2017 | Bhagwagar | C09J 183/14 |
| 2006/0270788 A1 * | 11/2006 | Ozai | C08L 83/04 524/786 |
| 2008/0096030 A1 | 4/2008 | Horikoshi et al. | |
| 2008/0213578 A1 | 9/2008 | Endo et al. | |
| 2009/0105441 A1 | 4/2009 | Ushio et al. | |
| 2011/0039738 A1 | 2/2011 | Nakayoshi et al. | |
| 2011/0163460 A1 * | 7/2011 | Kato | C08L 83/04 257/791 |

FOREIGN PATENT DOCUMENTS

| | | |
|---|---|---|
| CN | 101775216 A | 7/2010 |
| JP | S50105573 A | 8/1975 |
| JP | S05155870 A | 5/1976 |

(Continued)

OTHER PUBLICATIONS

Machine translation of JP 2009-221311 into English (no date).*

(Continued)

*Primary Examiner* — Marc S Zimmer
(74) *Attorney, Agent, or Firm* — Warner Norcross & Judd LLP

(57) ABSTRACT

Provided are a thermally conductive silicone composition excelling in heat resistance and thermal conductivity, in which thickening in an uncured state is suppressed, and which has excellent handling ease; and an electrical/electronic apparatus in which the thermally conductive silicone composition is used as a member.

The thermally conductive silicone composition comprises (A) 100 parts by mass of either i) (a1) an organopolysiloxane having, in each molecule thereof, at least one alkoxysilyl-containing group bonded to a silicon atom and expressed by the general formula:

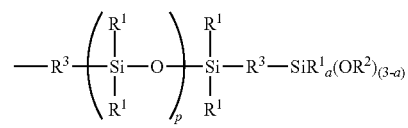

and as generally described herein, or ii) a mixture of component (a1) and (a2) an organopolysiloxane having in each molecule thereof, at least two alkenyl groups but not the alkoxysilyl-containing group. In the mixture, the content of component (a1) is 10 to less than 100 mass %. The thermally conductive silicone composition further comprises (B) 400 to 3,500 parts by mass of a thermally conductive filler.

20 Claims, No Drawings

(56) References Cited

FOREIGN PATENT DOCUMENTS

| | | | |
|---|---|---|---|
| JP | S61157587 A | 7/1986 | |
| JP | H04202496 A | 7/1992 | |
| JP | 2000256558 A | 9/2000 | |
| JP | 2006348119 A | 12/2006 | |
| JP | 2008101081 A | 5/2008 | |
| JP | 2009179714 A | 8/2009 | |
| JP | 2009-221311 | * | 10/2009 |
| JP | 201059237 A | 3/2010 | |
| WO | WO2014021980 | * | 2/2014 |

OTHER PUBLICATIONS

PCT/JP2015/001762 International Search Report dated Jun. 23, 2015, 4 pages.
English language abstract and machine translation for JP61157587 (A) extracted from http://worldwide.espacenet.com database on Nov. 2, 2016, 7 pages.
English language abstract and machine translation for JP4202496 (A) extracted from http://worldwide.espacenet.com database on Nov. 2, 2016, 6 pages.
Machine translation for JPS5155870 (a) extracted from https://www4.j-platpat.inpit.go.jp database on Jan. 6, 2017, 4 pages.
English language abstract and machine translation for CN101775216 (A) extracted from http://worldwide.espacenet.com database on Nov. 2, 2016, 12 pages.

* cited by examiner

THERMALLY CONDUCTIVE SILICONE COMPOSITION AND ELECTRICAL/ELECTRONIC APPARATUS

CROSS-REFERENCE TO RELATED APPLICATIONS

This application is the National Stage of International Application No. PCT/JP2015/001762 filed on 26 Mar. 2015, which claims priority to and all advantages of Japanese Patent Application No. 2014-079875 filed on 9 Apr. 2014, the content of which is hereby incorporated by reference.

TECHNICAL FIELD

The present invention relates to a thermally conductive silicone composition containing an organopolysiloxane having a specific alkoxysilyl-containing group, and a thermally conductive filler, and which excels in thermal conductivity and heat resistance and is capable of suppressing thickening in an uncured state. Moreover, the present invention also relates to an electrical/electronic apparatus provided with a member (including in the form of grease or a cured product) made from the thermally conductive silicone composition.

BACKGROUND ART

With the higher density and higher integration in recent years of printed circuit boards equipped with transistors, ICs, memory elements, and other electronic components, thermally conductive silicon grease compositions made from an organopolysiloxane and thermally conductive fillers, such as aluminum oxide powder and zinc oxide powder, have been used in order to efficiently dissipate the heat produced from the electronic components (see patent documents 1 to 3). However, a problem with this type of thermally conductive silicone grease composition is that the thermally conductive fillers cannot be filled at a high density, and thus, the heat dissipation property is insufficient.

Meanwhile, a thermally conductive silicone grease composition made from an organopolysiloxane, a thermally conductive filler, and an organohydrogen polysiloxane having at least three silicon-atom-bonded hydrogen atoms per molecule, has been proposed in order to achieve a high density filling of the thermally conductive filler in a thermally conductive silicone grease composition (see patent document 4). However, this type of thermally conductive silicone grease composition has a problem with heat resistance, that is to say, the composition exhibits fluidity through heating, if a thick coating has been carried out, or if coating onto a vertical surface has been carried out. In order to solve this problem, the inventors of this matter proposed a thermally conductive silicone grease composition containing an organopolysiloxane having alkoxysilyl groups bonded via silalkylene bonds to molecular chain termini and the like (see patent document 5). While this thermally conductive silicone grease composition excels in heat resistance and in the suppression of oil bleeding, the problems of thickening or gelation over time arise in some cases, such that further improvements are desired.

Elsewhere, from the viewpoint of improving adhesiveness, or the like, the applicants of this matter proposed a curable organopolysiloxane composition containing an alkoxysilyl-containing group indicated by the formula:

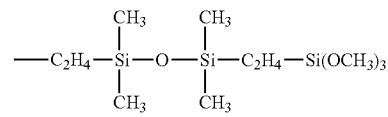
[Formula 1]

(patent document 6), and set forth a proposition to the effect that an aluminum oxide powder or the like may be optionally contained. However, neither a description nor a suggestion is provided in any form regarding the use of this composition as a thermally conductive silicone composition and the technical effects thereof.

PRIOR ART REFERENCES

Patent References

Patent Document 1: Japanese Unexamined Patent Application Publication No. S50-105573
Patent Document 2: Japanese Unexamined Patent Application Publication No. S51-55870
Patent Document 3: Japanese Unexamined Patent Application Publication No. S61-157587
Patent Document 4: Japanese Unexamined Patent Application Publication No. H4-202496
Patent Document 5: Japanese Unexamined Patent Application Publication No. 2009-179714
Patent Document 6: Japanese Unexamined Patent Application Publication No. 2006-348119

SUMMARY OF INVENTION

Problems to be Solved by the Invention

The present invention was devised in order to solve the above problems, and an object thereof is to provide a thermally conductive silicone composition excelling in heat resistance and thermal conductivity, which suppresses thickening in an uncured state, and which has excellent handling ease, and to provide an electrical/electronic apparatus which uses the thermally conductive silicone composition as a member.

SUMMARY OF THE INVENTION

As a result of earnest studies, the inventors of the present invention discovered that the above problems can be resolved through a thermally conductive silicone composition containing (A) 100 parts by mass of either (a1) an organopolysiloxane having, in each molecule thereof, at least one alkoxysilyl-containing group bonded to a silicon atom and expressed by the general formula:

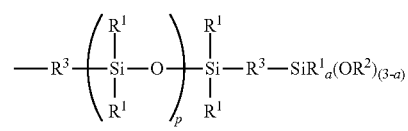
[Formula 2]

(wherein the $R^1$ groups represent identical or different monovalent hydrocarbon groups having no aliphatic unsaturated bond, the $R^2$ group represents an alkyl group, the $R^3$ groups represent identical or different alkylene groups, a represents an integer from 0 to 2, and p represents an integer from 1 to 50), or a mixture of the component (a1) and (a2) an organopolysiloxane having in each molecule at least two alkenyl groups but not the alkoxysilyl-containing group {the amount of the component (a1) contained in the mixture is 10 to 100 mass % (without including 100 mass %)}; and (B) 400 to 3,500 parts by mass of a thermally conductive filler; and thereby arrived at the present invention.

Namely, the object of the present invention is achieved through [1] a thermally conductive silicone composition containing (A) 100 parts by mass of either (a1) an organopolysiloxane having, in each molecule thereof, at least one alkoxysilyl-containing group bonded to a silicon atom and expressed by the general formula:

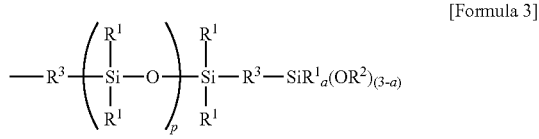

[Formula 3]

(wherein, the $R^1$ groups represent identical or different monovalent hydrocarbon groups having no aliphatic unsaturated bond, the $R^2$ group represents an alkyl group, the $R^3$ groups represent identical or different alkylene groups, a represents an integer from 0 to 2, and p represents an integer from 1 to 50), or a mixture of the component (a1) and (a2) an organopolysiloxane having in each molecule at least two alkenyl groups but not the alkoxysilyl-containing group {the amount of the component (a1) contained in the mixture is 10 to 100 mass % without including 100 mass %)}; and (B) 400 to 3,500 parts by mass of a thermally conductive filler. [2] The thermally conductive silicone composition according to [1], wherein the alkoxysilyl-containing group in the component (A) is a group expressed by the following formula:

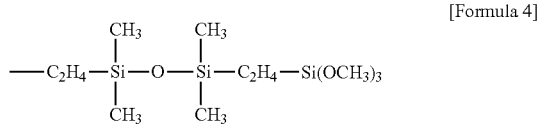

[Formula 4]

[3] The thermally conductive silicone composition according to [1] or [2], wherein the average particle diameter of the component (B) is from 0.01 to 100 μm. [4] The thermally conductive silicone composition according to any of [1] to [3], wherein the component (B) is a metal-based powder, a metal oxide-based powder, a metal nitride-based powder, or a carbon powder. [5] The thermally conductive silicone composition according to any of [1] to [4], wherein the component (B) is silver powder, aluminum powder, aluminum oxide powder, zinc oxide powder, aluminum nitride powder, or graphite. [6] The thermally conductive silicone composition according to any of [1] to [5], wherein the component (B) is (B1) boron nitride powder in plate form having an average particle diameter of 0.1 to 30 μm, (B2) boron nitride powder in granular form having an average particle diameter of 0.1 to 50 μm, (B3) aluminum oxide powder in spherical form and/or pulverized form having an average particle diameter of 0.01 to 50 μm, or (B4) graphite having an average particle diameter of 0.01 to 50 μm, or a mixture of two or more types thereof. [7] The thermally conductive silicone composition according to any of [1] to [6], which is a thermally conductive silicone grease composition. [8] The thermally conductive silicone composition according to any of [1] to [6], which is a curable thermally conductive silicone composition. [9] An electrical/electronic apparatus provided with a member made from the thermally conductive silicone composition according to any of [1] to [6].

Note that the object of the present invention can also be achieved by an electrical/electronic apparatus provided with a member made from the thermally conductive silicone composition.

Effects of Invention

The present invention allows for the provision of: a thermally conductive silicone composition excelling in heat resistance and thermal conductivity, in which thickening in an uncured state is suppressed, and which has excellent handling ease; and an electrical/electronic apparatus in which said thermally conductive silicone composition is used as a member.

DESCRIPTION OF THE EMBODIMENTS

The thermally conductive silicone composition of the present invention contains 100 parts by mass of (A) an organopolysiloxane having in each molecule a specific alkoxysilyl group or a mixture containing the organopolysiloxane, and (B) 400 to 3,500 parts by mass of a thermally conductive filler, and may be a non-curable (grease type) thermally conductive silicone grease composition, or a curable thermally conductive silicone composition which is cured to form a gelled object or a cured product. This composition is described below.

The component (A) is either (a1) an organopolysiloxane having, in each molecule, at least one alkoxysilyl-containing group bonded to a silicon atom and expressed by the general formula:

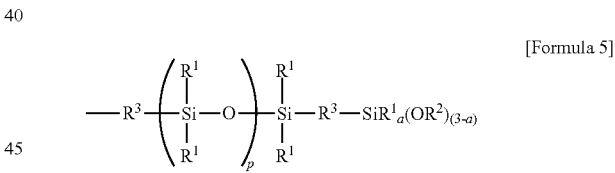

[Formula 5]

(wherein the $R^1$ groups represent identical or different monovalent hydrocarbon groups having no aliphatic unsaturated bond, the $R^2$ group represents an alkyl group, the $R^3$ groups represent identical or different alkylene groups, a represents an integer from 0 to 2, and p represents an integer from 1 to 50), or a mixture of the component (a1) and (a2) an organopolysiloxane having but not the alkoxysilyl-containing group {the amount of the component (a1) contained in the mixture is 10 to 100 mass % (without including 100 mass %)}. Accordingly, while the component (a1) may be used alone, or may be used as a mixture with the component (a2), the component (a1) must be contained at an amount of 10 mass % or greater of the entirety.

The component (a1) is the main agent of the present composition, suppresses thickening in an uncured state, and, owing to having an alkoxysilyl group in the molecule, also functions as a surface treatment agent for the component (B). Therefore, even if the component (B) is filled at a high density so as to reach 400 to 3,500 parts by mass with respect to the entirety of the component (A) (100 parts by mass), thickening of the obtained composition is suppressed, and handling ease is not compromised.

The component (a1) is an organopolysiloxane having in each molecule at least one alkoxysilyl-containing group bonded to a silicon atom and expressed by the above general formula. In the above formula, the $R^1$ group represents an alkyl group, a methyl group, an ethyl group, a propyl group, a butyl group, a pentyl group, or a hexyl group, and is preferably a methyl group. Moreover, in the abovementioned formula, the $R^2$ groups represent identical or different monovalent hydrocarbon groups having no aliphatic unsaturated bond, illustrated by: alkyl groups such as methyl group, ethyl group, propyl group, butyl group, pentyl group, hexyl group, heptyl group, octyl group, nonyl group, decyl group, and octadecyl group; cycloalkyl groups such as cyclopentyl group, and cyclohexyl group; aryl groups such as phenyl group, tolyl group, xylyl group, and naphthyl group; aralkyl groups such as benzyl group, phenylethyl group, and phenylpropyl group; and alkyl halide groups such as 3-chloropropyl group, and 3,3,3-trifluoropropyl group; preferably an alkenyl group or an aryl group, and particularly preferably a methyl group or a phenyl group. Moreover, in the abovementioned formula, the $R^3$ groups represent identical or different divalent organic groups, illustrated by: alkylene groups such as ethylene group, propylene group, butylene group, pentylene group, hexylene group, heptylene group, and octylene group; alkylene oxyalkylene groups such as ethylene oxyethylene group, propylene oxyethylene group, and propylene oxypropylene group; preferably an alkylene group, and more preferably an ethylene group. Moreover, in the abovementioned formula, p represents an integer from 1 to 50, preferably an integer from 1 to 10, and more preferably an integer from 1 to 5. Moreover, in the abovementioned formula, a represents an integer from 0 to 2, and preferably 0.

Examples of this type of alkoxysilyl-containing group serving as examples of the alkoxysilyl-containing group expressed by the abovementioned general formula, include for instance groups represented by the formula:

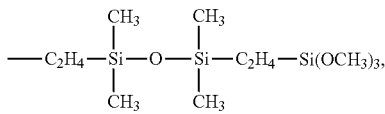

[Formula 6]

groups represented by the formula:

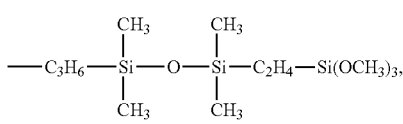

[Formula 7]

groups represented by the formula:

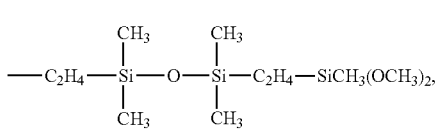

[Formula 8]

groups represented by the formula:

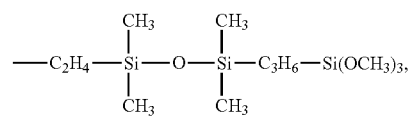

[Formula 9]

groups represented by the formula:

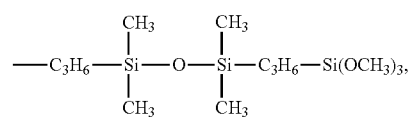

[Formula 10]

groups represented by the formula:

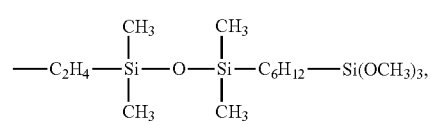

[Formula 11]

and groups represented by the formula:

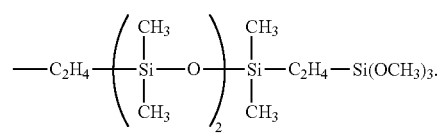

[Formula 12]

Moreover, the component (a1) may optionally have an average of 0.5 or more alkenyl groups, and in particular, having an alkenyl group is preferable when the thermally conductive silicone composition is cured by a hydrosilylation reaction. In this case, examples of the alkenyl group include vinyl group, allyl group, butenyl group, pentenyl group, and hexenyl group, the vinyl group being preferable. Furthermore, examples of other organic groups bonded to a silicon atom in the component (a1) include the same monovalent hydrocarbon groups having no aliphatic unsaturated bond as those mentioned above for $R^1$, such as, alkyl groups, cycloalkyl groups, aryl groups, aralkyl groups, and alkyl halide groups; the alkyl groups and the aryl groups being preferable, and the methyl group and the phenyl group being particularly preferable. In particular, when the thermally conductive silicone composition of the present invention is curable, having at least an average of at least 0.5 to less than 20 alkenyl groups per molecule is preferable. The bonding positions of these alkenyl groups are not limited, and may be either at a terminus of a molecular chain or at a side chain of the molecular chain.

While the component (a1) has in each molecule at least one of the abovementioned alkoxysilyl-containing groups, having in each molecule at least two alkoxysilyl-containing groups is preferable in order to fill the component (B) at high density, suppress thickening in an uncured state, and realize excellent handling ease. Moreover, while the upper limit of the number of alkoxysilyl-containing groups in each molecule is not particularly limited, not more than 20 is preferable. The reason is that, even if the number of alkoxysilyl-containing groups in each molecule exceeds 20, remarkable improvements cannot be anticipated in the ability to suppress thickening and improve handling ease when the thermally conductive filler is filled at a high density. Moreover, the bonding positions of the alkoxysilyl-containing groups are not limited, and may be either at a terminus of the molecular chain, or at a side chain of the molecular chain.

The molecular structure of the component (a1) is not particularly limited, and for example may be a straight chain shape, a straight chain shape having partial branching, a branched chain shape, a network shape, or a dendritic shape. The component (a1) may also be a mixture of organopolysiloxanes having such types of molecular structure. In particular, the component (a1) is preferably a straight chain shaped organopolysiloxane having the abovementioned alkoxysilyl-containing groups bonded to silicon atoms at both termini of the molecular chain and at side chains of the molecular chain. Moreover, while the viscosity of the component (a1) at 25° C. is not particularly limited, a viscosity of at least 20 mPa·s is preferable, and a viscosity in the range of 100 to 1,000,000 mPa·s is particularly preferable. The reason is that, when the viscosity is lower, the physical properties of the obtained cured product, particularly flexibility and stretching properties, decrease significantly.

Examples of this type of component (a1) include organopolysiloxanes expressed by the average formula:

[Formula 13]

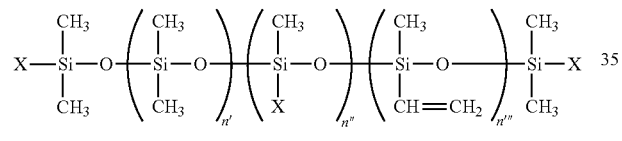

organopolysiloxanes expressed the by average formula:

[Formula 14]

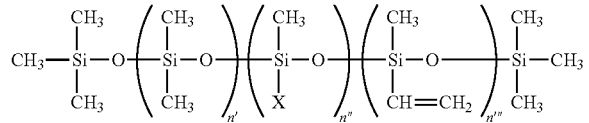

organopolysiloxanes expressed the by average formula:

[Formula 15]

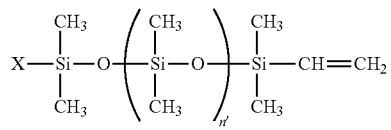

and organopolysiloxanes expressed by the average unit formula:

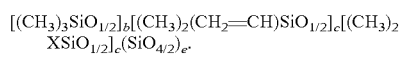

$[(CH_3)_3SiO_{1/2}]_b[(CH_3)_2(CH_2=CH)SiO_{1/2}]_c[(CH_3)_2XSiO_{1/2}]_d(SiO_{4/2})_e$.

Note that in the formulas, X represents an alkoxysilyl-containing group given as an example above, n' and n" each represents an integer of 1 or greater, and n''' represents a number of 0 or greater. Furthermore, b, d, and e represent positive numbers, and c represents a number of 0 or greater.

This type of component (a1) can be prepared by subjecting an alkenyl group-containing organopolysiloxane to a hydrosilylation reaction of the alkenyl group, with an alkoxysilyl group-containing siloxane represented by the following general formula:

[Formula 16]

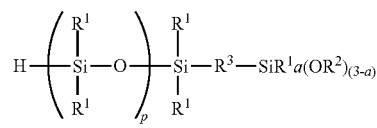

in the presence of a hydrosilylation reaction catalyst. Note that $R^1$, $R^2$, $R^3$, p, and a in the abovementioned formula are the same as those described above. Also note that if the alkenyl-group-containing organopolysiloxane and the alkoxysilyl-group-containing siloxane at an amount equivalent to or greater than that of the alkenyl groups are reacted, an organopolysiloxane having alkoxysilyl-containing groups and having no alkenyl group can be obtained.

The component (a2) is an optional component, which is an organopolysiloxane having in each molecule at least two alkenyl groups but not the alkoxysilyl-containing group. Such component (a2), aside from remaining in the mixture with the component (a1) when the alkenyl group-containing organopolysiloxane and the alkoxysilyl-containing siloxane represented by the abovementioned general formula:

[Formula 17]

$$H-\left(\begin{array}{c}R^1\\|\\Si-O\\|\\R^1\end{array}\right)_p\begin{array}{c}R^1\\|\\Si-R^3-SiR^1{}_a(OR^2)_{(3-a)}\\|\\R^1\end{array}$$

at an amount that is less than one equivalent with respect to the alkenyl groups are reacted, may be added separately from the relevant reactants.

Examples of the alkenyl group in the component (a2) include vinyl group, allyl group, butenyl group, pentenyl group, and hexenyl group, the vinyl group being preferable. The bonding position of the alkenyl group is not particularly limited, and examples include termini a terminus of the molecular chain, or a side chain of the molecular chain. Furthermore, examples of organic groups bonded to a silicon atom other than the alkenyl group in the component (a2) include the same monovalent hydrocarbon groups having no aliphatic unsaturated bond as those mentioned above for $R^2$, such as alkyl groups, cycloalkyl groups, aryl group, aralkyl groups, and alkyl halide groups, the alkyl groups and the aryl groups being preferable, and the methyl group and the phenyl group being particularly preferable. The molecular structure of the component (a2) is not particularly limited, and for example, may be a straight chain shape, a straight chain shape having partial branching, a branched chain shape, a ring shape, a network shape, or a dendritic shape. The component (a2) may be a mixture of two or more types having these molecular structures. In particular, the molecular structure of the component (a2) is preferably a straight chain shape. Moreover, the viscosity of the component (a2) at 25° C. is not particularly limited, and for example, a viscosity in the range of 20 to 1,000,000 mPa·s is preferable, and a viscosity in the range of 100 to 100,000 mPa·s is particularly preferable. The reason is that, if the viscosity at 25° C. is less than the lower limit of the range described above, in some cases, the physical properties of the composition that is obtained may decrease, and, on the other hand, if the upper limit of the abovementioned range is exceeded, there is a risk that the viscosity of the obtained composition will increase, and the handling ease could degrade significantly.

Examples of such a component (a2) include dimethylsiloxane-methylvinylsiloxane copolymers capped at both molecular chain termini with trimethylsiloxy groups, dimethylsiloxane-methylvinylsiloxane-methylphenylsiloxane copolymers capped at both molecular chain termini with trimethylsiloxy groups, dimethylpolysiloxanes capped at both molecular chain termini with dimethylvinylsiloxy groups, methylphenylpolysiloxanes capped at both molecular chain termini with dimethylvinylsiloxy groups, dimethylsiloxane-methylvinylsiloxane copolymers capped at both molecular chain termini with dimethylvinylsiloxy groups, dimethylsiloxane-methylvinylsiloxane copolymers capped at both molecular chain termini with dimethylphenylsiloxy groups, and dimethylpolysiloxanes capped at both molecular chain termini with methylvinylphenylsiloxy groups.

The component (a2) is an optional component, and therefore the blending amount thereof is arbitrary; however, in a combined use with the component (a1), the amount of the component (a2) contained in the mixture between the component (a1) and the component (a2) is within the range of 0 to 90 mass % (without including 0 mass %); or in other words, an amount such that the amount of the component (a1) contained in the mixture is within the range of 10 to 100 mass % (without including 100 mass %).

The component (A) is the main agent of the thermally conductive silicone composition of the present composition, contains the component (a1) having the abovementioned alkoxysilyl containing-group, thereby effectively suppressing thickening of the composition in an uncured state, and, owing to having an alkoxysilyl group in the molecule, also functions as a surface treatment agent for the component (B). Therefore, even if the component (B) is filled at a high density so as to reach 400 to 3,500 parts by mass with respect to the entirety of the component (A) (100 parts by mass), thickening of the obtained composition is suppressed, allowing for the preparation of a composition excelling in thermal conductivity and having a viscosity at 25° C. of not more than 1500 mPa·s, preferably not more than 1000 mPa·s, and more preferably not more than 500 mPa·s, whereof the handling ease as a grease material or as a curable material is not compromised. Moreover, as desired, the component (A) may be a component for which a portion or the entirety thereof has a curable functional group, and may be: a hydrosilylation reaction curable organopolysiloxane; a condensation reaction curable organopolysiloxane cured through a condensation reaction such as dealcoholization condensation reaction, dehydration condensation reaction, dehydrogenation condensation reaction, oxime elimination condensation reaction, acetic acid elimination condensation reaction, or acetone elimination condensation reaction; a peroxide curable organopolysiloxane; a high energy beam curable organopolysiloxane cured through a high energy beam (for example, ultraviolet light) curing reaction such as mercapto-vinyl addition reaction, a radical reaction of an acrylic functional group, a cationic polymerization reaction of an epoxy group or a vinylether group; and the like.

Even if the component (A) is a component having an alkenyl group or other such curable functional group, if a curing catalyst or crosslinking agent is not blended thereto, use thereof as a non-curable silicone grease composition is possible, and is preferable. Note that even if the component (A) contains a below-mentioned (a3) organopolysiloxane having at least two silicon-bonded hydrogen atoms in each molecule, the obtained composition can be used as a non-curable silicone grease composition by not using a curing catalyst.

If the thermally conductive silicone composition of the present invention is a curable composition, the composition is not particularly limited with respect to the curing system thereof, but curing by a hydrosilylation reaction; a dealcoholization condensation reaction, dehydration condensation reaction, dehydrogenation condensation reaction, oxime elimination condensation reaction, acetic acid elimination condensation reaction, acetone elimination condensation reaction, or other such condensation reaction is preferable.

The thermally conductive silicone composition of the present invention may further contain (a3) an organopolysiloxane having at least two silicon atom-bonded hydrogen atoms in each molecule. In particular, by using an organopolysiloxane having silicon atom-bonded hydrogen atoms at both termini of the molecular chain and in the molecular chain, oil bleeding from the present composition (including a grease type composition in an uncured state) can be effectively suppressed in some cases.

If the component (A) is a hydrosilylation reaction curable organopolysiloxane, the component (a3) is a crosslinking agent for the organopolysiloxane having two alkenyl groups in each molecule in the presence of a hydrosilylation reaction catalyst. Examples of organic groups bonded to silicon atoms in the component (a3) include alkyl groups, a cycloalkyl group, aryl group, aralkyl group, alkyl halide group, and other such monovalent hydrocarbon groups not having an aliphatic unsaturated bond, and an alkyl group or aryl group is preferable, and particularly preferable is a methyl group or phenyl group. The molecular structure of the component (a3) is not particularly limited, and for example, may be a straight chain shape, a straight chain shape having partial branching, a branched chain shape, a ring shape, a mesh shape, or a dendritic shape, and a straight chain shape is preferable. Moreover, the viscosity at 25° C. of the component (a3) is not particularly limited; however, the viscosity is preferably in the range of 1 to 10,000 mPa·s.

Examples of this type of component (a3) include methylhydrogenpolysiloxane capped at both molecular chain termini with trimethylsiloxy groups, copolymers of methylhydrogensiloxane and dimethylsiloxane capped at both molecular chain termini with trimethylsiloxy groups, copolymers of methylhydrogensiloxane and dimethyl siloxane capped at both molecular chain termini with dimethylhydrogensiloxy groups, dimethylpolysiloxanes capped at both molecular chain termini with dimethylhydrogensiloxy groups, and mixtures of two or more of these organopolysiloxanes.

The amount of the component (a3) contained in the hydrosilylation reaction curable organopolysiloxane of the present invention is an amount such that the number of silicon atom-bonded hydrogen atoms in the component is within the range of 0.3 to 20 with respect to one alkenyl group in the components (a1) and (a2). This is because the obtained composition will not cure sufficiently if the content amount of the component (a3) is less than the lower limit of the abovementioned range, and if the upper limit of the abovementioned range is exceeded, hydrogen gas may be produced during the curing of the obtained composition, and the heat resistance of the cured product that is obtained may decrease significantly. Generally, the abovementioned conditions can be achieved by blending the component (a3) at an amount that is within the range of 0.5 to 50 parts by mass per a total of 100 parts by mass of the components (a1) and (a2).

The component (B) is a thermally conductive filler for imparting thermal conductivity to the composition of the present invention. This type of component (B) is preferably at least one or more types of powders and/or fibers selected from a group including pure metals, alloys, metal oxides, metal hydroxides, metal nitrides, metal carbides, metal silicides, carbon, soft magnetic alloys, and ferrite; and metal-based powder, a metal oxide-based powder, a metal nitride-based powder, or a carbon powder is preferable. The powders and/or fibers that are used may be treated with various surface treatment agents known as coupling agents. Examples of the surface treatment agent for treating the powder and/or fiber of the component (B) include surfactants, silane coupling agents, aluminum coupling agents, silicone surface treatment agents, and the like. In particular, by surface treating a below-described component (D) and/or the component (B) with an organopolysiloxane having silanol groups at both termini of the molecular chain and for which the viscosity at 25° C. is 20 to 100 mPa·s, and particularly preferably with dimethylpolysiloxane having silanol groups at both termini of the molecular chain and not having a reactive functional group other than the terminal silanol groups in the molecule, a composition can be achieved which excels in initial adhesiveness when cured at a relatively low temperature and for a short period of time, and which, after curing, excels particularly in adhesive durability and can realize a high level of adhesive strength, and when the composition is formed as a single liquid type curable composition, in some cases, sufficient usability time (storage time and handling time) can be ensured.

Examples of pure metals include bismuth, lead, tin, antimony, indium, cadmium, zinc, silver, copper, nickel, aluminum, iron, and metal silicon. Examples of alloys include alloys consisting of two or more types of metals selected from a group including bismuth, lead, tin, antimony, indium, cadmium, zinc, silver, aluminum, iron, and metal silicon. Examples of the metal oxide include alumina, zinc oxide, silicon oxide, magnesium oxide, beryllium oxide, chromium oxide, or titanium oxide. Examples of the metal hydroxide include magnesium hydroxide, aluminum hydroxide, barium hydroxide, or calcium hydroxide. Examples of the metal nitride is boron nitride, aluminum nitride, or silicon nitride. Examples of metal carbides include silicon carbide, boron carbide, and titanium carbide. Examples of metal silicides include magnesium silicide, titanium silicide, zirconium silicide, tantalum silicide, niobium silicide, chromium silicide, tungsten silicide, and molybdenum silicide. Examples of carbon include diamond, graphite, fullerene, carbon nanotubes, graphene, activated carbon, and amorphous carbon black. Examples of soft magnetic alloys include Fe—Si alloys, Fe—Al alloys, Fe—Si—Al alloys, Fe—Si—Cr alloys, Fe—Ni alloys, Fe—Ni—Co alloys, Fe—Ni—Mo alloys, Fe—Co alloys, Fe—Si—Al—Cr alloys, Fe—Si—B alloys, and Fe—Si—Co—B alloys. Examples of ferrite include Mn—Zn ferrite, Mn—Mg—Zn ferrite, Mg—Cu—Zn ferrite, Ni—Zn ferrite, Ni—Cu—Zn ferrite, and Cu—Zn ferrite. The component (B) is preferably at least one type of powder and/or fiber selected from these components.

Note that the component (B) is preferably a silver powder, aluminum powder, aluminum oxide powder, zinc oxide powder, aluminum nitride powder, or graphite. Moreover, when an electrical insulating property is required of the present composition, the component (B) is preferably a metal oxide-based powder, or a metal nitride-based powder, and is particularly preferably an aluminum oxide powder, a zinc oxide powder, or an aluminum nitride powder.

The shape of the component (B) is not particularly limited, and examples thereof include spherical, needle-like, disc-like, rod-like, and irregular shapes, and spherical and irregular shapes are preferable. Moreover, the average particle diameter of the component (B) is not particularly limited, but is preferably in the range of 0.01 to 100 µm, and is more preferably in the range of 0.01 to 50 µm. With the present invention, for example, a component (B) having a large particle diameter and a component (B) having a small particle diameter can be combined and used for the purpose of improving thixotrophy and achieving a high level of filling, and when doing so, thermally conductive fillers having different particle diameters may be the same type of different types.

The component (B) is particularly preferably (B1) a plate-shaped boron nitride powder having an average particle diameter of 0.1 to 30 µm, (B2) a granular boron nitride powder having an average particle diameter of 0.1 to 50 µm, (B3) a spherical and/or pulverized aluminum oxide powder having an average particle diameter of 0.01 to 50 µm, or (B4) spherical and/or pulverized graphite having an average particle diameter of 0.01 to 50 µm, or is a mixture of two or more types thereof.

The content of the component (B) relative to 100 parts by mass of the component (A) is within the range of from 400 to 3,500 parts by mass, and preferably is in the range of from 400 to 3,000 parts by mass. This is because if the content amount of the component (B) is less than the lower limit of the range described above, the thermal conductivity of the composition that is obtained will be insufficient, and on the other hand, if the content amount thereof exceeds the upper limit of the abovementioned range, the viscosity of the obtained composition will increase remarkably, and the handling ease will decrease as a result. Therefore, if the content amount of the component (B) is within the abovementioned range, the thermally conductive silicone composition of the present invention can be obtained as a composition excelling in thermal conductivity and having a viscosity at 25° C. of not more than 1500 mPa·s, preferably not more than 1000 mPa·s, and more preferably not more than 500 mPa·s, and the composition exhibits extremely excellent handling ease even as a grease material and as a curable material.

The thermally conductive silicone composition of the present invention contains the component (A) and the component (B), and therefore is preferably a non-curable thermally conductive silicone grease composition, but may be a curable thermally conductive silicone composition.

In the case of a curable composition thereof, the thermally conductive silicone composition of the present invention contains (C) a curing catalyst, and depending on the curing reaction system of the component (A), one or more types can be selected from a hydrosilylation reaction catalyst; a condensation reaction catalyst; an organic acid peroxide, an azo-based compound, or other radical polymerization initiator; and a photosensitizer, and can be used. With a protective agent composition of the electrical/electronic apparatus of the present invention, use of a hydrosilylation reaction curable organopolysiloxane or a condensation reaction curable organopolysiloxane is preferable, and a hydrosilylation reaction catalyst or a condensation reaction catalyst is preferably contained. Moreover, the curing system may also contain both the hydrosilylation reaction catalyst and the condensation reaction catalyst.

The hydrosilylation reaction catalyst is a component for causing curing of the present composition containing a hydrosilylation reaction curable organopolysiloxane. Examples of such a component include platinum-based catalysts such as platinum black, platinum-supported activated carbon, platinum-supported silica micro powders, chloroplatinic acids, alcohol solutions of chloroplatinic acids, olefin complexes of platinum, and vinylsiloxane complexes of platinum; palladium-based catalysts such as tetrakis(triphenylphosphine)palladium; and rhodium-based catalysts. The component (C) is particularly preferably a hydrosilylation reaction catalyst. The usage amount thereof is the catalytic amount, and can be selected, as appropriate, in accordance with the desired curing conditions, but the usage amount thereof is generally in a range of approximately 1 to 1000 ppm per the curable organopolysiloxane.

The condensation reaction catalyst is a component for curing the composition or the present invention containing a condensation reaction curable organopolysiloxane On the other hand, by using a hydrosilylation reaction curable organopolysiloxane and a hydrosilylation reaction catalyst in combination, in some cases, curability and adhesiveness to various base materials with heating of the present composition from room temperature to not more than 50 degrees can be improved. Examples of this type of condensation reaction catalyst include tin compounds such as dimethyltin dineodecanoate and stannous octoate; and titanium compounds such as tetra(isopropoxy)titanium, tetra(n-butoxy) titanium, tetra(t-butoxy)titanium, di(isopropoxy)bis(ethylacetoacetate)titanium, di(isopropoxy)bis(methylacetoacetate)titanium, and di(isopropoxy)bis(acetylacetonate)titanium, and the like. The usage amount thereof is the catalytic amount, and can be selected, as appropriate, in accordance with the desired curing conditions, but the usage amount thereof is generally in the range of 0.01 to 5 parts by mass per 100 parts by mass of the curable organopolysiloxane in the overall composition.

The composition according to the present invention may be blended, as appropriate, with optional components to improve storage stability and handling ease, including 2-methyl-3-butyn-2-ol, 3,5-dimethyl-1-hexyn-3-ol, 2-phenyl-3-butyn-2-ol, 1-ethynyl cyclohexanol and other acetylene-based compounds; 3-methyl-3-penten-1-yne, 3,5-dimethyl-3-hexen-1-yne and other ene-yne compounds; 1,3,5,7-tetramethyl-1,3,5,7-tetravinyl cyclotetrasiloxane, 1,3,5,7-tetramethyl-1,3,5,7-tetrahexenyl cyclotetrasiloxane, benzotriazole and other triazoles, phosphines, mercaptans, hydrazines, and other curing inhibitors. The content amount of these curing inhibitors should be selected, as appropriate, in accordance with the curing conditions of the present composition, and for example, the content amount thereof is preferably within the range of 0.001 to 5 parts by mass per a total of 100 parts by mass of the organopolysiloxane having a reactive functional group. Note that if the present composition is cured at room temperature, the composition thereof preferably does not contain a curing inhibitor.

The thermally conductive silicone composition according to the present invention may contain, as another optional component, (D) a silica-based filler. Examples of the component (D) include fumed silica, melted silica, precipitated silica, and a filler obtained by surface treating the aforementioned silicas with organoalkoxysilanes, organochlorosilanes, organosilazanes, or other such organic silicon compounds. In particular, by surface treating the component (B) and/or the component (D) with an organopolysiloxane having silanol groups at both termini of the molecular chain and for which the viscosity at 25° C. is 20 to 100 mPa·s, and particularly preferably with dimethylpolysiloxane having silanol groups at both termini of the molecular chain and not having a reactive functional group other than the terminal silanol groups in the molecule, a composition can be achieved which excels in initial adhesiveness when cured at a relatively low temperature and for a short period of time, and which, after curing, excels particularly in adhesive durability and can realize a high level of adhesive strength, and when the composition is formed as a single liquid type curable composition, in some cases, sufficient usability time (storage time and handling time) can be ensured.

The content amount of the component (D) is not particularly limited, and is preferably within the range of from 1 to 100 parts by mass, even more preferably within the range of 1 to 50 parts by mass, and particularly preferably within the range of 1 to 20 parts by mass per 100 parts by mass of the component (A).

The present composition may also contain (E) a coupling agent as another optional component. Examples of the component (E) include methyl trimethoxy silane, ethyl trimethoxy silane, butyl trimethoxy silane, hexyl trimethoxy silane, octyl trimethoxy silane, 3-aminopropyl trimethoxy silane, N-(2-aminoethyl)-3-aminopropyl trimethoxy silane, 3-glycidoxypropyl trimethoxy silane, 2-(3,4-epoxy cyclohexyl)ethyl trimethoxy silane, 3-methacryloxypropyl trimethoxy silane, 3-mercaptopropyl trimethoxy silane, and other such silane coupling agents; tetrabutyl titanate, tetraisopropyl titanate, and other titanium coupling agents.

The content of the component (E) is not particularly limited, but is preferably in the range of 0.1 to 10 parts by mass, and more preferably from 0.1 to 5 parts by mass, per 100 parts by mass of the component (A).

Furthermore, the present composition may contain other optional components within a range that does not hinder the object of the present invention, including, for example, carbon black, red iron oxide and other pigments; as well as dyes, fluorescent dyes, heat-resistant additives, flame retardancy imparting agents, plasticizers, and adhesion imparting agents.

The method for preparing the present composition is not particularly limited, and examples include a method of simultaneously mixing the component (A) and the component (B); a method of mixing the component (A), the component (B), and the component (E), and then adding the component (a3) thereto, and mixing; and a method of mixing the component (A), the component (B), and the component (D), and then mixing the component (a3) therewith. In particular, when the present composition is a curable thermally conductive silicone composition, the curing catalyst, which is the component (C), and optional curing inhibitor are preferable added after the abovementioned mixing step.

Furthermore, when mixing the components (A) and (B), these components are preferably heated and mixed, and are particularly preferably heated and mixed at a temperature of 100 to 200° C. under reduced pressure conditions. In particular, in order to facilitate surface treatment of the component (B) when the component (A) is an organopolysiloxane having an alkoxysilyl-containing group, acetic acid, phosphoric acid, or other such acidic substance, and trialkylamine, quaternary ammonium salts, ammonia gas, ammonium carbonate, or other such basic substances may also be added at the catalytic amount simultaneously with the abovementioned heating and mixing, or separate from the abovementioned heating and mixing The thermally conductive silicone composition of the present invention is useful as a heat transfer material (thermally conductive member) interposed at an interface between a thermal boundary surface of a heat generating electronic component and a heat sink or heat dissipation member of a circuit board or the like in order to cool electrical and electronic components through heat conduction. An electrical or electronic component provided with a member made from the thermally conductive silicone composition is not particularly limited, and for example, may be an electronic circuit board such as a printed circuit board; an IC chip packaged with an optical semiconductor element such as a diode (LED), an organic electric field element (organic EL), an laser diode, and an LED array; a CPU used in a personal computer, a digital video disk, a cell phone, a smartphone, or other such electronic device; a driver IC, memory, or other such LSI chip, and the like. In particular, with high performance digital switching circuits formed with high integration density, heat loss (heat dissipation) is a main factor with respect to the performance and reliability of an integrated circuit, and a thermally conductive member (including a cured product or grease) obtained using the thermally conductive silicone composition of the present invention excels in heat dissipation and handling ease even when used in a power semiconductor application such as in engine control in a transport machine, in a powertrain system, and for air conditioning control; and the thermally conductive member thereof can realize superior heat resistance and thermal conductivity even when incorporated and used under harsh environmental conditions in electronic components for vehicle use such as in an electronic control unit (ECU).

Examples of materials constituting the abovementioned electrical and electronic components include resin, ceramics, glass, metals such as aluminum, and the like. The thermally conductive silicone composition of the present invention can be used by being applied to these base materials, as a non-curable thermally conductive silicone grease composition, or as a curable thermally conductive silicone composition.

EXAMPLES

The present invention will be described below using examples, but the present invention is not limited thereto. Moreover, the adhesiveness of the protective agent composition of electrical and electronic components according to the present invention was evaluated using the following method.

[Viscosity] The viscosity of the thermally conductive silicone composition was measured using a rheometer (AR550) from TA Instruments. For the geometry, a plate having a diameter of 20 mm was used. Note that the viscosity was treated as a value of a shear rate of 1 (1/s). Moreover, for those compositions whereof thickening was pronounced in the mixing process, the viscosity was evaluated as "×". (Thermal conductivity). The thermal resistances at 50° C. of 200 μm-thick and 500 μm-thick thermally conductive silicone grease compositions, each having a surface area of 1 cm×1 cm, were measured using a resin material thermal resistance measuring device from Hitachi, Ltd., and the thermal conductivity was determined from the values thereof.

Each component used in Table 1 is as follows. Note that the viscosity at 25° C. is a value that was measured using a rotational viscometer. [Component (A1-1): Organopolysiloxane (0.6) having the following alkoxysilyl-containing group]

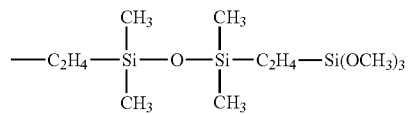

[Formula 18]

(a1-1) Polysiloxane modified at both termini: Dimethylpolysiloxane having the alkoxysilyl-containing groups at both termini of the molecular chain (viscosity of 400 mPa·s) (a1-2) Single terminus modified (Vi) siloxane: Dimethylsiloxane having the alkoxysilyl-containing group at only one terminus of the molecular chain, and having the other terminus capped with a dimethylvinylsiloxy group (viscosity of 400 mPa·s, Vi content amount of 0.12 mass %) (a1-3) Vi polysiloxane with both termini capped: Dimethylsiloxane having both termini of the molecular chain capped with dimethylvinylsiloxy groups (viscosity of 400 mPa·s, Vi content amount of 0.24 mass %); the components (a1-1) to (a1-3) above are mixtures prepared and obtained by hydrosilylation reaction, in the presence of a hydrosilylation reaction catalyst, between the dimethylsiloxane (viscosity of 400 mPa·s) having both termini of the molecular chain capped with dimethylvinylsiloxy groups, and the following alkoxysilyl-containing siloxane adjusted to 0.6 molar equivalents vinyl group. The parts by mass in Table 1 are theoretical values.

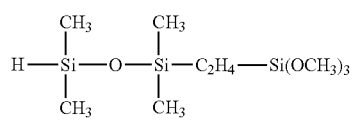

[Formula 19]

[Component (A1-2): Organopolysiloxane (1.0) having the following alkoxysilyl-containing group] Polysiloxane modified at both termini: dimethylpolysiloxane having the above alkoxysilyl-containing groups at both termini of the molecular chain (viscosity of 400 mPa·s) prepared and obtained by hydrosilylation reaction in the presence of a hydrosilylation reaction catalyst between the dimethylsiloxane capped at both termini of the molecular chain with dimethylvinylsiloxy groups (viscosity of 400 mPa·s), and the alkoxysilyl-containing siloxane adjusted to 1.0 molar equivalents per vinyl group. (A2) Dimethylpolysiloxane capped at both termini of the molecular chain with trimethylsiloxy groups (viscosity of 500 mPa·s); (A3) Siloxane with both termini capped with Vi: Dimethylpolysiloxane capped at both termini of the molecular chain with dimethylvinyl siloxy groups (viscosity of 400 mPa·s, Vi content amount of 0.44 mass %); (a4) SiH siloxane: Copolymer of methylhydrogensiloxane-dimethylsiloxane capped at both termini of the molecular chain with trimethylsiloxy groups (viscosity of 5 mPa·s, Si—H content amount of 0.72 mass %); (B1) Alumina: aluminum oxide powder in spherical form having an average particle diameter of 12 μm; (B2) AlN: aluminum nitride powder in pulverized form having an average particle diameter of 2 μm; (B3) BN: boron nitride powder in flake form having an average particle diameter of 10 μm; (d1) TM silane: methyltrimethoxy silane; (C) Pt complex: 1,3-divinyl-1,1,3,3-tetramethyl disiloxane complex of platinum (an amount such that the platinum metal reaches 10 ppm as shown in Table 1 in mass units with respect to the total of the organopolysiloxane components in the present composition).

Examples 1 to 5

At the number of parts shown in Table 1, the organopolysiloxane having an alkoxysilyl-containing group, the siloxane with both termini capped with Vi, and a thermally conductive filler, which is the component (B), were premixed for 30 minutes at room temperature, after which the mixture was heated and mixed for 60 minutes at 150° C. under reduced pressure. Next, the mixture was cooled to room temperature, and as necessary, (a3) SiH siloxane and (C) a Pt complex were added to obtain a thermally conductive silicone composition in grease form (Examples 1, 2, 4, and 5) or a curable thermally conductive silicone composition (Example 3).

Comparative Examples 1 to 5

At the number of parts shown in Table 1, each component was premixed for 30 minutes at room temperature, after which the mixture was heated and mixed for 60 minutes at 150° C. under reduced pressure. Next, the mixture was cooled to room temperature, and a thermally conductive silicone composition in grease form was obtained. Note that a composition whereof thickening was pronounced in the mixing step was evaluated as "x".

mally conductive grease that can be used in practical applications could not be prepared.

INDUSTRIAL APPLICABILITY

The abovementioned thermally conductive silicone composition excels in heat resistance and thermal conductivity, and also provides excellent handling ease with low viscosity, and therefore when used as a heat dissipating component such as for a highly integrated CPU, an LSI chip, or an IC chip packaged with an optical semiconductor element, the performance and reliability thereof can be improved. In particular, the present invention is useful as a heat dissipating component of power devices for which demand has been increasing in recent years, including, for example, control of motors used under high temperature conditions, transport machine motor control, power generation systems, or space transport systems; and is also useful as a heat dissipating component for engine control of transport machines, general purpose inverter control for powertrain systems, air-conditioning control, and the like, electronic components used in vehicles such as electronic control units (ECU), servo motor control, motor control of machine tools, elevators, and the like, motor control for electric vehicles, hybrid cars, and railway transport vehicles, power generator systems for solar, wind force, and fuel cell power generation and the like, and for space transport systems used in space, and the like.

TABLE 1-A

| Component (parts by mass) | Example 1 | Example 2 | Example 3 | Example 4 | Comparative Example 1 | Comparative Example 2 | Example 5 | Comparative Example 3 |
|---|---|---|---|---|---|---|---|---|
| (A1-1) Alkoxysilyl-modified Si | 100 | | 100 | | | | 100 | |
| (A1-2) Alkoxysilyl-modified Si | | 100 | | | | | | |
| (A2) Dimethylpolysiloxane | | | | | 100 | | | |
| (A3) Siloxane with both termini Vi-capped | | | | | | 100 | 15 | 100 |
| (a4) SiH siloxane | | | 2.5 | | | | | |
| (B1) Alumina | 1019 | 1019 | 714 | 540 | 1019 | 540 | 714 | 569 |
| (B2) AlN | | | | 218 | | 218 | | |
| (B3) BN | | | 102 | | | | 102 | 88 |
| (C) Pt complex | | | 10 ppm* | | | | | |
| (d1) TM silane | | | | | 2.5 | 2.5 | | |
| Viscosity | 289 | 512 | 135 | 825 | 945 | 4000 | 1200 | x |
| Thermal conductivity | 4.2 | 4.1 | 0.9 | 3.3 | 4 | 3.2 | 3.1 | — |

With the thermally conductive silicone compositions of the present invention shown in Examples 1 to 4, the overall viscosity was suppressed to 1000 mPa·s or less, and it was possible to realize a high level of thermal conductivity even when the various thermally conductive fillers were contained at an amount of approximately 10-times (in mass units) that of the silicone material, which is the main agent. On the other hand, with the thermally conductive silicone compositions shown in Comparative Examples 1 and 2, when the same amounts and same types of thermally conductive fillers were blended, thickening was pronounced and the handling ease was insufficient.

Moreover, with Example 5, which blended alumina and boron nitride as thermally conductive fillers, the thermally conductive silicone composition of the present application could realize a high level of thermal conductivity at a practical range of viscosity. On the other hand, with Comparative Example 3, which used the same type of thermally conductive fillers, thickening was pronounced, and a ther-

The invention claimed is:

1. A thermally conductive silicone composition comprising:
   (A) 100 parts by mass of either;
   i) (a1) an organopolysiloxane having, in each molecule thereof, an average of at least 0.5 alkenyl groups and at least one alkoxysilyl-containing group bonded to a silicon atom of a polysiloxane backbone of the (a1) organopolysiloxane and expressed by the general formula:

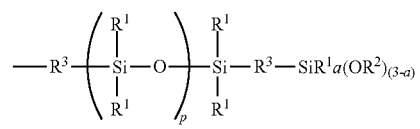

where the $R^1$ groups represent identical or different monovalent hydrocarbon groups having no aliphatic unsaturated bond, the $R^2$ group represents an alkyl group, the $R^3$ groups represent identical or different alkylene groups, a represents an integer from 0 to 2, and p represents an integer from 1 to 50, or ii) a mixture of component (a1) and (a2) an organopolysiloxane having, in each molecule thereof, at least two alkenyl groups but not the alkoxysilyl-containing group, where the amount of component (a1) contained in the mixture is 10 to less than 100 mass %; and (B) 400 to 3,500 parts by mass of a thermally conductive filler.

2. The thermally conductive silicone composition according to claim 1, wherein the alkoxysilyl-containing group in component (A) is a group expressed by the following formula:

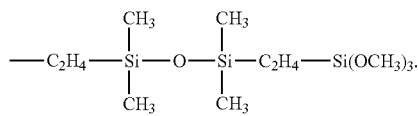

3. The thermally conductive silicone composition according to claim 1, wherein the average particle diameter of component (B) is from 0.01 to 100 μm.

4. The thermally conductive silicone composition according to claim 1, wherein component (B) is a metal-based powder, a metal oxide-based powder, a metal nitride-based powder, or a carbon powder.

5. The thermally conductive silicone composition according to claim 1, wherein component (B) is silver powder, aluminum powder, aluminum oxide powder, zinc oxide powder, aluminum nitride powder, or graphite.

6. The thermally conductive silicone composition according to claim 1, wherein component (B) is (B1) boron nitride powder in plate form having an average particle diameter of from 0.1 to 30 μm, (B2) boron nitride powder in granular form having an average particle diameter of from 0.1 to 50 μm, (B3) aluminum oxide powder in spherical form and/or pulverized form having an average particle diameter of from 0.01 to 50 μm, or (B4) graphite having an average particle diameter of from 0.01 to 50 μm, or a mixture of two or more types thereof.

7. The thermally conductive silicone composition according to claim 1, which is a thermally conductive silicone grease composition.

8. The thermally conductive silicone composition according to claim 1, which is a curable thermally conductive silicone composition.

9. An electrical/electronic apparatus provided with the thermally conductive silicone composition according to claim 1.

10. A heat dissipation member for an electrical/electronic apparatus, the heat dissipation member comprising the thermally conductive silicone composition according to claim 1.

11. The thermally conductive silicone composition according to 1, wherein component (a1) has at least two of the alkoxysilyl-containing groups.

12. The thermally conductive silicone composition according to 1, wherein component (a1) comprises a straight chain organopolysiloxane having the alkoxysilyl-containing groups bonded to silicon atoms at both termini of the molecular chain.

13. The thermally conductive silicone composition according to 1, wherein component (B) comprises aluminum oxide powder.

14. The thermally conductive silicone composition according to 7, which is free of a curing catalyst.

15. The thermally conductive silicone composition according to 8, further comprising (C) a curing catalyst.

16. The thermally conductive silicone composition according to 1, wherein component (a1) has an average of at least 0.5 and not more than 20 alkenyl groups.

17. The thermally conductive silicone composition according to 1, further comprising (a3) an organopolysiloxane having, in each molecule thereof, at least two silicon atom bonded hydrogen atoms.

18. The thermally conductive silicone composition according to 1, further comprising (D) a silica-based filler, (E) a coupling agent, or a combination thereof.

19. A curable thermally conductive silicone composition comprising:

(A) either;
  i) (a1) an organopolysiloxane having, in each molecule thereof, an average of at least 0.5 alkenyl groups and at least one alkoxysilyl-containing group bonded to a silicon atom and expressed by the general formula:

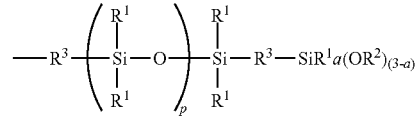

where the $R^1$ groups represent identical or different monovalent hydrocarbon groups having no aliphatic unsaturated bond, the $R^2$ group represents an alkyl group, the $R^3$ groups represent identical or different alkylene groups, a represents an integer from 0 to 2, and p represents an integer from 1 to 50, or ii) a mixture of component (a1) and (a2) an organopolysiloxane having, in each molecule thereof, at least two alkenyl groups but not the alkoxysilyl-containing group, where the amount of component (a1) contained in the mixture is 10 to less than 100 mass %; and (B) a thermally conductive filler.

20. The thermally conductive silicone composition according to claim 1, wherein the polysiloxane backbone of component (a1) is free from alkylene groups other than those present in the alkoxysilyl-containing group.

* * * * *